United States Patent
Yu

(10) Patent No.: US 6,407,414 B1
(45) Date of Patent: Jun. 18, 2002

(54) ELECTROSTATIC DISCHARGE PROTECTION DEVICE

(75) Inventor: Ta-Lee Yu, Hsinchu Hsien (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 09/949,919

(22) Filed: Sep. 12, 2001

(30) Foreign Application Priority Data

Mar. 13, 2001 (TW) .......................................... 90105814

(51) Int. Cl.$^7$ ........................ H01L 29/74; H01L 31/111
(52) U.S. Cl. ........................................ 257/173; 257/361
(58) Field of Search ................................. 257/173, 174, 257/361

(56) References Cited

U.S. PATENT DOCUMENTS 5,012,317 A * 4/1991 Rountre
6,242,763 B1 * 6/2001 Chen et al. .................. 257/107
6,246,079 B1 * 6/2001 Chen ........................... 257/173

* cited by examiner

Primary Examiner—Ngân V. Ngô
(74) Attorney, Agent, or Firm—Birch, Stewart, Kolasch & Birch, LLP

(57) ABSTRACT

The present invention provides an electrostatic discharge protection device, which comprises the following elements. A first-type substrate is coupled to the second voltage level. A first second-type well is formed on the first-type substrate and coupled to the first voltage level. A second second-type well is formed on the first-type substrate and coupled to the first voltage level. A first-type well is formed between the first second-type well and the second second-type well. A third second-type well is formed between the first-type substrate and the first-type well, and coupled to the first second-type well and the second second-type well. A first-type doped region is formed on the first second-type well and coupled to the pad, and a second-type doped region is formed on the first-type well and coupled to the second voltage level.

11 Claims, 2 Drawing Sheets

ELECTROSTATIC DISCHARGE PROTECTION DEVICE

BACKGROUND OF THE INVENTION

1. Field of the Invention

The present invention relates in general to an electrostatic discharge protection device. In particular, the present invention relates to an electrostatic discharge protection device immune to latch-up during normal operation.

2. Description of the Related Art

Electrostatic discharge (ESD) is a common phenomenon during the handling of semiconductor integrated circuit (IC) devices. Electrostatic charges may accumulate and cause potentially destructive effects on an IC device. ESD stress can typically occur during a testing phase of IC fabrication, during installation of the IC onto a circuit board, and during use of equipment into which the IC has been installed. Damage to a signal IC due to poor ESD protection in an electronic device can partially or completely disrupt its operation.

FIG. 1 shows a section view of a conventional floating well silicon-controlled rectifier (FW-SCR) formed in a substrate. Conventional floating well silicon-controlled rectifiers (FW-SCR) are usually located on a P-type silicon substrate 10. The P-type substrate 10 comprises an N-type well 11. A P-type doped region 12 is then formed in the N-type well 11. Next, an N-type doped region 14 and P-type doped region 15 are formed in the P-type substrate 10. The P-type doped region 12 is connected to a pad 1 connecting to an internal circuit 2. In addition, the N-type doped region 14 and the P-type doped region 15 are connected to a voltage level Vss. The voltage level Vss is usually ground when the device operates in normal mode.

Therefore, the P-type doped region 12, the N-type well 11, and the P-type silicon substrate 10 serve as the emitter, base, and collector, respectively, of a PNP bipolar junction transistor 20. The N-type well 11, the P-type silicon substrate 10, and the N-type doped region 14 serve as the collector, base, emitter, respectively, of an NPN bipolar junction transistor 21. FIG. 2 shows the equivalent circuit diagram of the protection circuit shown in FIG. 1, and the resistor 22 represents the spreading resistance between the N-type doped region 14 and the P-type silicon substrate 10.

During normal operation, however, latch-up may be abnormally induced by the holes in the substrate during positive triggering, and result in disorder or even error if noise interferes with the integrated circuit.

SUMMARY OF THE INVENTION

The object of the present invention is to provide an electrostatic discharge protection device, which adds a first-type deep well to the conventional electrostatic discharge protection device. The first-type deep well is formed between the second-type substrate and a second-type well connected to a predetermined voltage level, and adjoins to the first-type wells, which surround the second-type well. Therefore, the first-type deep well and the first-type wells around the second-type well besiege the second-type well completely, apart from the second-type well and the substrate. Moreover, the first-type well is provided a predetermined voltage to avoid noise or interference current entering the second-type well and causing latch-up.

Moreover, according the present invention, the types of silicon-controlled rectifier are not only floating well, but also low-voltage (LVTSCR), or lateral (LSCR).

To achieve the above-mentioned object, the present invention provides an electrostatic discharge protection device, which comprises the following elements. A first-type substrate is coupled to the second voltage level. A first second-type well is formed on the first-type substrate and coupled to the first voltage level. A second second-type well is formed on the first-type substrate and coupled to the first voltage level. A first-type well is formed between the first second-type well and the second second-type well. A third second-type well is formed between the first-type substrate and the first-type well, and coupled to the first second-type well and the second second-type well. A first-type doped region is formed on the first second-type well and coupled to the pad, and a second-type doped region is formed on the first-type well and coupled to the second voltage level.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

First Embodiment

Figure 3:
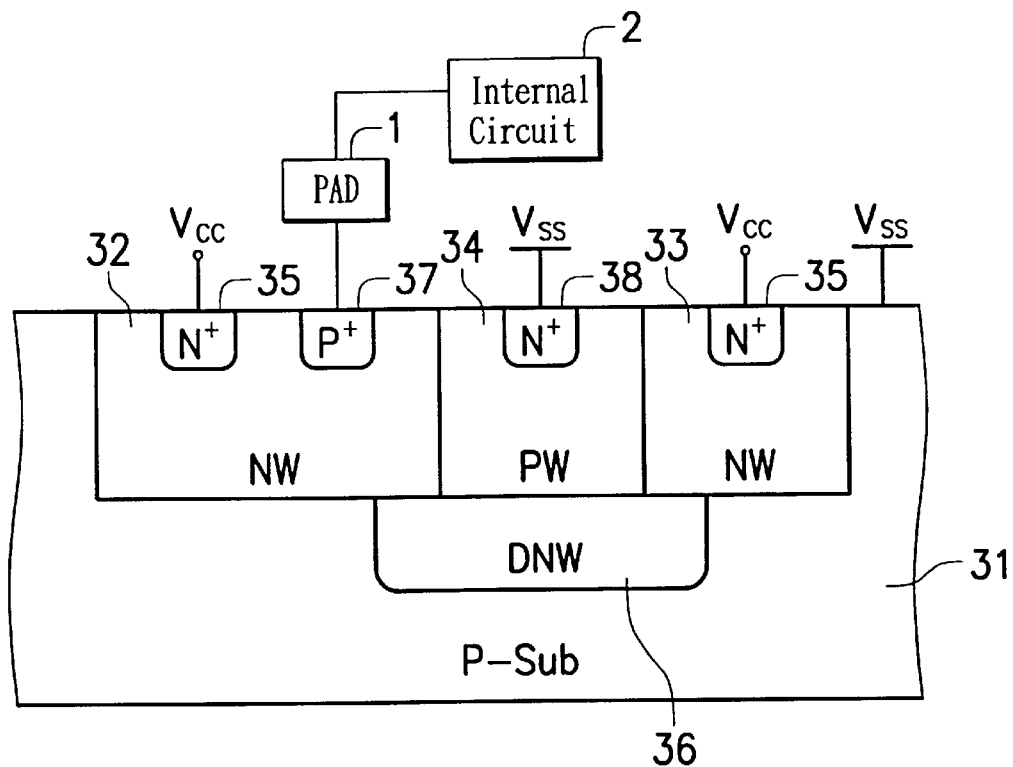
FIG. 3 shows a section view of an electrostatic discharge protection device formed in a substrate according to the first embodiment of the present invention.

FIG. 3 shows a section view of an electrostatic discharge protection device formed in a substrate according to the first embodiment of the present invention. The electrostatic discharge protection device according to the first embodiment is connected to a pad 1, a positive voltage level Vcc and a ground voltage level. The electrostatic discharge protection device according to the first embodiment comprises a P-type substrate 31, a first N-type well 32, a second N-type well 33, a P-type well 34, a third N-type well 36, a P-type doped region 37, and an N-type doped region 38. The P-type substrate 31 is coupled to the ground voltage level Vss. The N-type wells 32 and 33 are formed on the P-type substrate 31 and coupled to the positive voltage level Vcc. The second N-type well 33 is formed on the P-type substrate 31 and coupled to the positive voltage level Vcc. The connection point between the first N-type well 32, the second N-type well 33, and the positive voltage level Vcc are N-type doped regions 35. The P-type well 34 is formed between the first N-type well 32 and the second N-type well 33. The third N-type well 36 is formed between the P-type substrate 31 and the P-type well 34, and coupled to the first N-type well 32 and the second N-type well 33. Due to the third N-type well 36 being located in deep position of the P-type substrate 31, the third N-type well 36 is referred to as deep N-Well. As shown in FIG. 3, the P-type well 34 is separated from the P-type substrate 31 by the first N-type well 32, the second N-type well 33, and the N-type well 36. In addition, the P-type doped region 37 is formed on the first N-type well 32 and coupled to the pad 1, which is connected to the internal circuit, and the N-type doped region 38 is formed on the P-type well 34 and coupled to the ground voltage level Vss.

Figure 1:
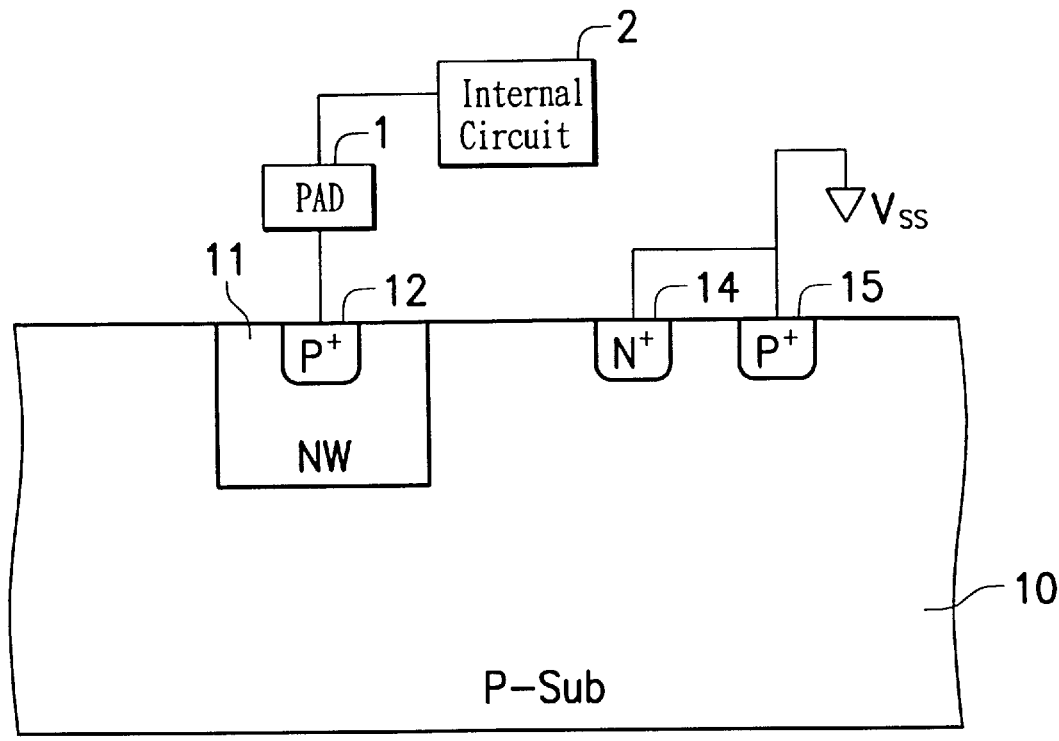
FIG. 1 shows a section view of a conventional floating well silicon-controlled rectifier (FW-SCR) formed in a substrate.
Figure 2:
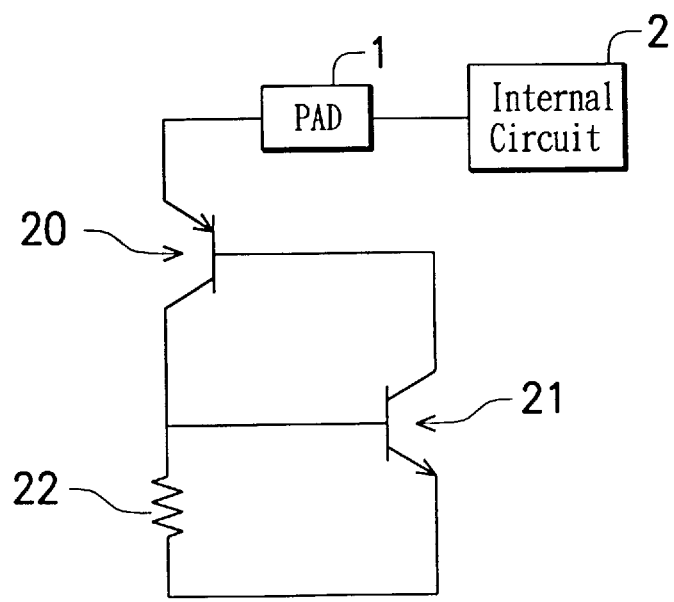
FIG. 2 shows the equivalent circuit diagram of the protection circuit shown in FIG. 1.

Therefore, the P-type doped region 37, the N-type well 32, and the P-type silicon substrate 31 serve as the emitter, base, and collector, respectively, of a PNP bipolar junction transistor 20. The N-type well 32, the P-type silicon substrate 31, and the N-type doped region 38 serve as the collector, base, and emitter, respectively, of an NPN bipolar junction transistor 21. The PNP bipolar junction transistor 20 and the NPN bipolar junction transistor 21 constitute a SCR. FIG. 2, shows the equivalent circuit diagram of the protection circuit of the first embodiment according to the present invention.

In the first embodiment of the present invention, the P-type well 34 is separated from the P-type substrate 31 by the N-type well 36, 32, and 33. Moreover, the N-type wells 32, 33, and 36 are provided a positive voltage Vcc to avoid noise or interference current entering the P-type well 34 and causing latch-up.

Second Embodiment

Figure 4:
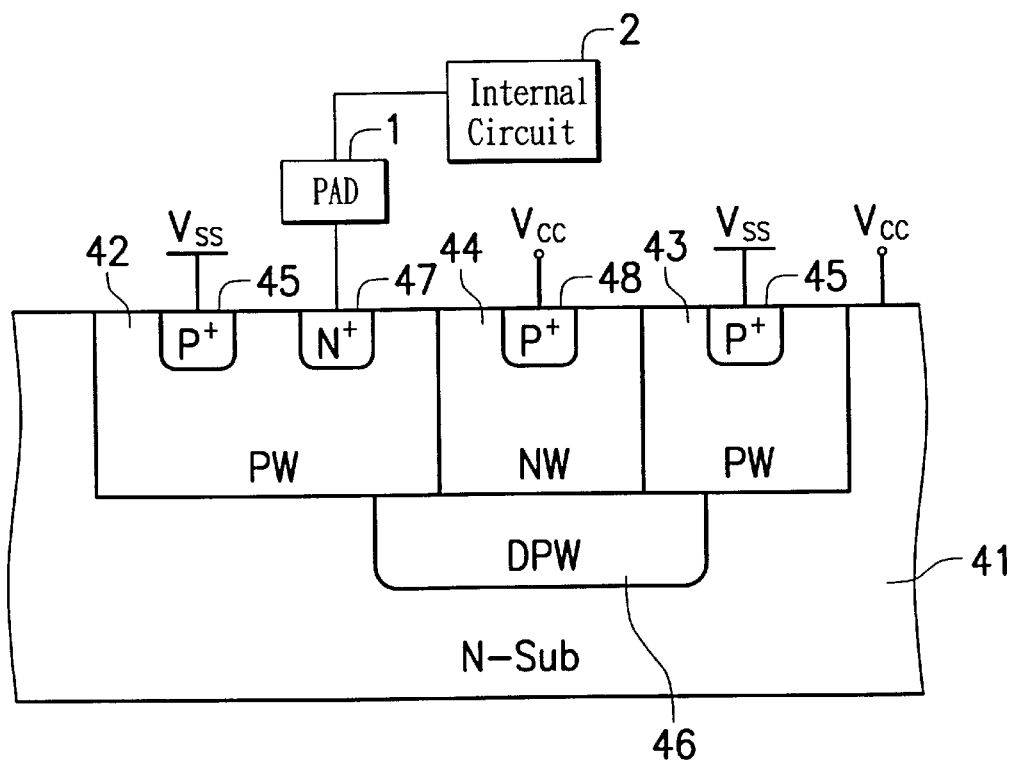
FIG. 4 shows a section view of an electrostatic discharge protection device formed in a substrate according to the second embodiment of the present invention.

FIG. 4 shows a section view of an electrostatic discharge protection device formed in a substrate according to the second embodiment of the present invention. The electrostatic discharge protection device according to the second embodiment is connected to a pad 1, a positive voltage level Vcc and a ground voltage level. The electrostatic discharge protection device according to the first embodiment comprises an N-type substrate 41, a first P-type well 42, a second P-type well 43, an N-type well 44, a third P-type well 46, an N-type doped region 47, and a P-type doped region 48. The N-type substrate 41 is coupled to the positive voltage level Vcc. The P-type wells 42 and 43 are formed on the N-type substrate 41 and coupled to the ground voltage level Vss. The second P-type well 43 is formed on the N-type substrate 41 and coupled to the ground voltage level Vss. The connection point between the first P-type well 42, the second P-type well 43, and the ground voltage level Vss are P-type doped regions 45. The N-type well 44 is formed between the first P-type well 42 and the second P-type well 43. The third P-type well 46 is formed between the N-type substrate 41 and the N-type well 44, and coupled to the first P-type well 42 and the second P-type well 43. Due to the third P-type well 46 being located in deep position of the N-type substrate 41, the third P-type well 46 is referred to as deep N-Well. As shown in FIG. 4, the N-type well 44 is separated from the N-type substrate 41 by the first P-type well 42, the second P-type well 43 and the P-type well 46. In addition, the N-type doped region 47 is formed on the first P-type well 42 and coupled to the pad 1, which is connected to the internal circuit 2, and the P-type doped region 48 is formed on the N-type well 44 and coupled to the POSITIVE voltage level Vcc.

Therefore, the N-type doped region 47, the P-type well 42, and the N-type silicon substrate 41 serve as the emitter, base, and collector, respectively, of an NPN bipolar junction transistor. The P-type well 42, the N-type silicon substrate 41, and the P-type doped region 48 serve as the collector, base, emitter, respectively, of a PNP bipolar junction transistor. The PNP bipolar junction transistor and the NPN bipolar junction transistor constitute a SCR. FIG. 2 shows the equivalent circuit diagram of the protection circuit of the first embodiment according to the present invention.

In the second embodiment according to the present invention, the N-type well 44 is separated from the N-type substrate 41 by the P-type wells 46, 42, and 43. Moreover, the N-type wells 42, 43, and 46 are provided a ground voltage Vss to avoid noise or interference current entering the n-type well 44 and causing latch-up.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An electrostatic discharge protection device located between a pad, a first voltage level, and a second voltage level, comprising:
   a first-type substrate coupled to the second voltage level;
   a first second-type well formed on the first-type substrate and coupled to the first voltage level;
   a second second-type well formed on the first-type substrate and coupled to the first voltage level;
   a first-type well formed between the first second-type well and the second second-type well;
   a third second-type well formed between the first-type substrate and the first-type well, and coupled to the first second-type well and the second second-type well;
   a first-type doped region formed on the first second-type well and coupled to the pad; and
   a second-type doped region formed on the first-type well and coupled to the second voltage level.

2. The electrostatic discharge protection device as claimed in claim 1, wherein the first-type well is P-type well.

3. The electrostatic discharge protection device as claimed in claim 2, wherein the first second-type well, the second second-type well, and the third second-type well are N-type wells.

4. The electrostatic discharge protection device as claimed in claim 3, wherein the first voltage level is a positive level.

5. The electrostatic discharge protection device as claimed in claim 4, wherein the second voltage level is a ground level.

6. The electrostatic discharge protection device as claimed in claim 1, wherein the first-type well is N-type well.

7. The electrostatic discharge protection device as claimed in claim 6, wherein the first second-type well, the second second-type well, and the third second-type well are P-type wells.

8. The electrostatic discharge protection device as claimed in claim 7, wherein the first voltage level is a ground level.

9. The electrostatic discharge protection device as claimed in claim 8, wherein the second voltage level is a positive level.

10. An electrostatic discharge protection device located between a pad, a positive voltage level, and a ground voltage level, comprising:
    a P-type substrate coupled to the ground voltage level;
    a first N-type well formed on the P-type substrate and coupled to the positive voltage level;
    a second N-type well formed on the P-type substrate and coupled to the positive voltage level;
    a P-type well formed between the first N-type well and the second N-type well;
    a third N-type well formed between the P-type substrate and the P-type well, and coupled to the first N-type well and the second N-type well;

a P-type doped region formed on the first N-type well and coupled to the pad; and an N-type doped region formed on the P-type well and coupled to the ground voltage level.

11. An electrostatic discharge protection device located between a pad, a positive voltage level, and a ground voltage level, comprising:

an N-type substrate coupled to the positive voltage level;

a first P-type well formed on the N-type substrate and coupled to the ground voltage level;

a second P-type well formed on the N-type substrate and coupled to the ground voltage level;

an N-type well formed between the first P-type well and the second P-type well;

a third P-type well formed between the N-type substrate and the N-type well, and coupled to the first P-type well and the second P-type well;

an N-type doped region formed on the first P-type well and coupled to the pad; and a P-type doped region formed on the N-type well and coupled to the ground voltage level.

* * * * *